United States Patent
Hsu et al.

(10) Patent No.: US 8,759,175 B2
(45) Date of Patent: Jun. 24, 2014

(54) FLASH MEMORY STRUCTURE WITH ENHANCED CAPACITIVE COUPLING COEFFICIENT RATIO (CCCR) AND METHOD FOR FABRICATION THEREOF

(75) Inventors: Louis C. Hsu, Fishkill, NY (US); Xu Ouyang, Hopewell Junction, NY (US); Ping-Chuan Wang, Hopewell Junction, NY (US); Zhijian J. Yang, Stormville, NY (US)

(73) Assignee: International Business Machines Corporation, Armonk, NY (US)

(*) Notice: Subject to any disclaimer, the term of this patent is extended or adjusted under 35 U.S.C. 154(b) by 269 days.

(21) Appl. No.: 13/429,556

(22) Filed: Mar. 26, 2012

(65) Prior Publication Data

US 2012/0184076 A1    Jul. 19, 2012

Related U.S. Application Data

(62) Division of application No. 12/027,496, filed on Feb. 7, 2008, now Pat. No. 8,193,575.

(51) Int. Cl.
*H01L 21/00* (2006.01)

(52) U.S. Cl.
USPC ............................ 438/207; 438/218; 438/219

(58) Field of Classification Search
CPC ................. G01L 21/8249; G01L 21/28525; G01L 21/823807; G01L 21/76224
USPC ................................. 438/207, 218–219, 294
See application file for complete search history.

(56) References Cited

U.S. PATENT DOCUMENTS

| | | |
|---|---|---|
| 5,129,981 A | 7/1992 | Wang et al. |
| 5,129,982 A | 7/1992 | Wang et al. |
| 5,889,305 A | 3/1999 | Choi et al. |
| 6,602,750 B2 | 8/2003 | Kao |
| 6,914,013 B2 | 7/2005 | Chung |
| 7,049,238 B2 | 5/2006 | Doan et al. |
| 7,432,153 B2 | 10/2008 | Tsunoda et al. |
| 7,696,043 B2 | 4/2010 | Lee |

*Primary Examiner* — Tran Tran
(74) *Attorney, Agent, or Firm* — Scully, Scott, Murphy & Presser, P.C.; H. Daniel Schnurmann

(57) ABSTRACT

A flash memory structure having an enhanced capacitive coupling coefficient ratio (CCCR) may be fabricated in a self-aligned manner while using a semiconductor substrate that has an active region that is recessed within an aperture with respect to an isolation region that surrounds the active region. The flash memory structure includes a floating gate that does not rise above the isolation region, and that preferably consists of a single layer that has a U shape. The U shape facilitates the enhanced capacitive coupling coefficient ratio.

20 Claims, 6 Drawing Sheets

FLASH MEMORY STRUCTURE WITH ENHANCED CAPACITIVE COUPLING COEFFICIENT RATIO (CCCR) AND METHOD FOR FABRICATION THEREOF

CROSS REFERENCE TO RELATED APPLICATION

This application is a divisional of U.S. patent application Ser. No. 12/027,496, filed Feb. 7, 2008 the entire content and disclosure of which is incorporated herein by reference.

FIELD OF THE INVENTION

The present invention generally relates to flash memory structures within the field of semiconductor manufacturing. More particularly, the invention relates to flash memory structures with enhanced performance within the field of semiconductor manufacturing.

DESCRIPTION OF THE RELATED ART

A conventional flash memory structure includes a control gate located at least in-part over a floating gate that in-turn is located over a semiconductor substrate. The floating gate is separated from the semiconductor substrate by a tunneling dielectric. In addition, the control gate is separated from the floating gate by an intergate dielectric. Tunneling dielectrics and intergate dielectrics often comprise oxide dielectric materials, such as but not limited to silicon oxide dielectric materials.

Digital data storage within a flash memory structure is typically achieved by applying a programming voltage between the control gate and the semiconductor substrate to thereby inject charge carriers into, or discharge charge carriers from, the floating gate with respect to the semiconductor substrate. The intergate dielectric electrically isolates the control gate from the floating gate, but nonetheless allows for transfer of at least part of a control voltage from the control gate to the floating gate. An amount of control voltage transferred from the control gate to the floating gate is proportional to a capacitive coupling coefficient ratio (CCCR) of a particular flash memory structure. In general, higher values of a capacitive coupling coefficient ratio provide for lower programming voltages (i.e., either write programming voltages or erase programming voltages) within a particular flash memory structure. As a simple approximation, a capacitive coupling coefficient ratio is defined as a ratio of Cid to (Cid+Ctd), where Cid is the capacitance related to the intergate dielectric and Ctd is the capacitance related to the tunneling dielectric.

Flash memory structures and flash memory devices that exhibit an enhanced capacitive coupling coefficient ratio are known in the semiconductor fabrication art.

For example, Kao, in U.S. Pat. No. 6,602,750, teaches a particular flash memory memory structure that provides an enhanced capacitive coupling coeffieient ratio. To achieve the enhanced capacitive coupling coefficient ratio, this particular flash memory structure uses a recess within a floating gate in the flash memory structure, where the recess is filled by a control gate within the flash memory structure.

In addition, Chung, in U.S. Pat. No. 6,914,013, teaches another particular flash memory structure that provides an enhanced capacitive coupling coefficient ratio. To achieve the enhanced capacitive coupling coeffieient ratio, this particular flash memory structure includes the use of designated geometric constraints for portions of an intergate dielectric that is located at a corner of a floating gate within the flash memory structure, in comparison with other portions of the intergate dielectric within the flash memory structure.

Flash memory structures are likely to continue to be prominent as semiconductor structure and semiconductor device fabrication technology continues to advance. Thus, desirable are flash memory structures, and methods for fabricating those flash memory structures, that provide the flash memory structures with enhanced performance, and/or manufacturability advantage.

SUMMARY

The invention provides a flash memory structure and method for fabricating the flash memory structure. The flash memory structure includes a floating gate located within, and not rising above, a first aperture within an isolation region at the bottom of which first aperture is an active region of a semiconductor substrate within and upon which is fabricated the flash memory structure. Preferably, the floating gate consists of a single U shaped layer that defines a second aperture into which is sequentially located and formed an intergate dielectric and a control gate.

By virtue of the geometric constraints of the U shaped floating gate that defines the foregoing second aperture, the flash memory structure of the invention is provided with an enhanced capacitive coupling coefficient ratio (i.e., generally at least about 0.65, in comparison with a capacitive coupling coefficient ratio of about 0.45 to about 0.55 for a conventional planar flash memory structure having a stacked and co-extensive control gate and floating gate absent a second aperture of a U shape).

The invention also contemplates that the inventive flash memory structure may be fabricated using a self-aligned method. Use of such a self-aligned method, in addition to the use of a floating gate that does not rise above the isolation region, provides that the inventive flash memory structure is fabricated with enhanced manufacturability.

A particular flash memory structure in accordance with the invention includes a semiconductor substrate. This particular flash memory structure also includes an isolation region partially embedded within the semiconductor substrate, where the isolation region defines a first aperture at the bottom of which is an active region of the semiconductor substrate. This particular flash memory structure also includes a tunneling dielectric located upon the active region at the bottom of the first aperture. This particular flash memory structure also includes a floating gate located upon the tunneling dielectric, where the floating gate does not rise above the isolation region. This particular flash memory structures also includes a conformal intergate dielectric located upon the floating gate. This particular flash memory structure also includes a control gate located upon the conformal intergate dielectric. This particular flash memory structure also includes a plurality of source and drain regions located within the active region at locations not covered by the floating gate.

Another particular flash memory structure in accordance with the invention includes a semiconductor substrate. This other particular flash memory structure also includes an isolation region partially embedded within the semiconductor substrate, where the isolation region defines a first aperture at the bottom of which is an active region of the semiconductor substrate. This other particular flash memory structure also includes a tunneling dielectric located upon the active region at the bottom of the first aperture. This other particular flash memory structure also includes a U shaped floating gate located upon the tunneling dielectric, where the U shaped floating gate does not rise above the isolation region, and where the U shaped floating gate also includes a second aperture. This other particular flash memory structure also includes a conformal intergate dielectric located upon the U shaped floating gate. This other particular flash memory structure also includes a control gate located upon the conformal intergate dielectric. This other particular flash memory structure also includes a plurality of source and drain regions located within the active region at locations not covered by the U shaped floating gate.

A particular method for fabricating a flash memory structure includes providing a semiconductor substrate that includes an isolation region that surrounds an active region of the semiconductor substrate. This particular method also includes recessing the active region with respect to the isolation region to provide a recessed active region within a first aperture within the isolation region. This particular method also includes forming upon the recessed active region a tunneling dielectric. This particular method also includes forming upon the tunneling dielectric a floating gate that does not rise above the isolation region. This particular method also includes forming upon the floating gate an intergate dielectric. This particular method also includes forming upon the intergate dielectric a control gate. This particular method also includes forming within the active region at locations not covered by the floating gate a plurality of source and drain regions.

BRIEF DESCRIPTION OF THE DRAWINGS

The objects, features and advantages of the invention are understood within the context of the Description of the Preferred Embodiment, as set forth below. The description of the preferred embodiment is understood within the context of the accompanying drawings, that form a material part of this disclosure, wherein.

DESCRIPTION OF THE PREFERRED EMBODIMENTS

The invention, which includes a flash memory structure and method for fabricating the flash memory structure, is understood within the context of the description as set forth below. The description set forth below is understood within the context of the drawings described above. Since the drawings are intended for illustrative purposes, the drawings are not necessarily drawn to scale.

Figure 1:
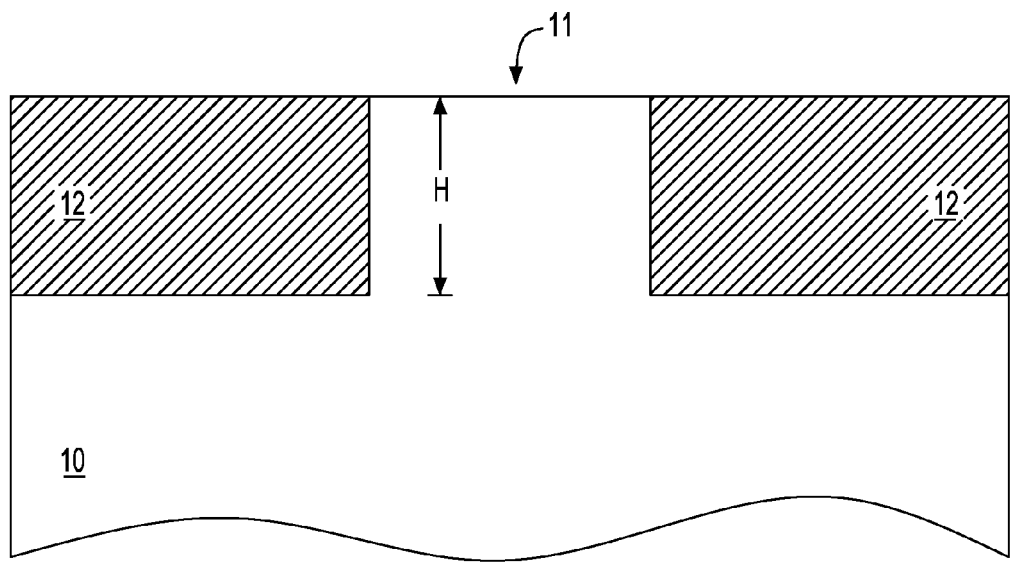
FIG. 1 to FIG. 10 show a series of schematic cross-sectional, plan-view and perspective-view diagrams illustrating the results of progressive stages in fabricating a flash memory structure in accordance with a particular embodiment of the invention.

FIG. 1 to FIG. 10 show a series of schematic cross-sectional, plan-view and perspective-view diagrams illustrating the results of progressive stages in fabricating a flash memory structure in accordance with a particular embodiment of the invention. This particular embodiment of the invention comprises a sole preferred embodiment of the invention. FIG. 1 shows a schematic cross-sectional diagram of the particular flash memory structure at an early stage in the fabrication thereof in accordance with this particular sole preferred embodiment.

FIG. 1 shows a semiconductor substrate 10 that includes an active region 11 that is bounded and surrounded by an isolation region 12 which is embedded within the semiconductor substrate 10 and adjoining the active region 11.

The semiconductor substrate 10 may comprise any of several semiconductor materials that are otherwise generally conventional in the semiconductor fabrication art. Non-limiting examples of such semiconductor materials include silicon, germanium, silicon-germanium alloy, silicon-carbon alloy, silicon-germanium-carbon alloy and compound semiconductor materials. Non-limiting examples of compound semiconductor materials include gallium arsenide, indium arsenide and indium phosphide semiconductor materials. Typically, the semiconductor substrate 10 comprises a silicon or silicon-germanium alloy semiconductor material that has a generally conventional thickness and any one of several conventional crystallographic orientations. The embodiment also contemplates that the semiconductor substrate 10 may comprise a semiconductor-on-insulator (SOI) substrate or a hybrid orientation (HOT) substrate, as well as the bulk semiconductor substrate that is nominally illustrated in FIG. 1.

Semiconductor-on-insulator substrates include a buried dielectric layer interposed between a base semiconductor substrate portion and a surface semiconductor layer portion of a semiconductor substrate. Hybrid orientation substrates include multiple semiconductor regions of different crystallographic orientation.

The isolation region 12 comprises an isolation material, and in particular a dielectric isolation material, that is otherwise generally conventional in the semiconductor fabrication art. Included in particular, but also not limiting the embodiment or the invention, are silicon oxide dielectric materials, silicon nitride dielectric materials and silicon oxynitride dielectric materials, as well as laminates and composites of those dielectric materials. Oxides, nitrides and oxynitrides of elements other than silicon (i.e., also including laminates and composites thereof) are also not excluded as dielectric materials from which may be comprised the isolation region 12.

The isolation region 12 may be fabricated using methods that are also otherwise generally conventional in the semiconductor fabrication art. Included in particular are methods that provide for fabrication of an isolation trench that is filled with an appropriate dielectric isolation material. Dielectric isolation materials may generally be formed using methods including but not limited to thermal or plasma oxidation or nitridation methods, chemical vapor deposition methods (including atomic layer deposition (ALD) methods) and physical vapor deposition methods (including sputtering methods).

As is finally illustrated within the schematic cross-sectional diagram of FIG. 1, the active region 11 of the semiconductor substrate 10 includes a mesa of height H that is nominally equal to a thickness of the isolation region 12. The height H of the mesa is at least about 500 nanometers and more typically from about 700 to about 2000 nanometers in order to accommodate further processing of the inventive flash memory structure described as follows.

As is understood by a person skilled in the art, the height H of the mesa, and in particular the correlating corresponding thickness of the isolation region 12, may be used to isolate a flash memory structure in accordance with the embodiment and the invention, as well as a conventional metal oxide semiconductor (MOS) structure that is located and formed separate from the flash memory structure in another location within the semiconductor substrate 10. In order to provide an effective isolation of both the flash memory structure and the metal oxide semiconductor structure, the embodiment and the invention contemplate that the thickness of the isolation region 12 is desirably greater than a thickness of an isolation region intended to isolate a conventional metal oxide semiconductor structure, plus a thickness of a floating gate within a flash memory structure that is fabricated incident to further processing of the semiconductor structure that is illustrated in FIG. 1.

A generally conventional isolation region within a semiconductor structure is typically located fully embedded (i.e., but with an exposed surface) within a semiconductor substrate. Typically, such a conventional isolation region has a thickness from about 200 to about 400 nanometers, where such a thickness from about 200 to about 400 nanometers is dependent on the depth of source and drain region junctions within a generally conventional metal oxide semiconductor field effect device structure. A thickness of a floating gate of a conventional flash memory structure may be in a range from about 100 to about 200 nanometers. A height of an inner sidewall of a U shaped floating gate as will be illustrated within the context of further description below may be in a range of at least about 400 nanometers. To accommodate the foregoing dimensions, a total height H of the mesa that includes the active region 11, as well as a corresponding thickness of the isolation region 12 is at least about 500 nanometers.

As noted above, and as will be illustrated in further detail below, a floating gate within a flash memory structure in accordance with the instant embodiment is preferably but not necessarily fabricated in a "U" shape (i.e., but with a generally flat bottom and nominally straight sidewalls that are generally perpendicular to the generally flat bottom) and thus includes an aperture (i.e., a second aperture) therein, wherein the existence of the inner sidewalls in the aperture within the U shaped floating gate provides an enhanced capacitive coupling coefficient ratio within the flash memory structure. Such an enhanced capacitive coupling coefficient ratio derives from an increased intergate capacitive coupling area between a control gate and the U shaped floating gate within the instant inventive flash memory structure, in comparison with a tunneling capacitive coupling area between the U shaped floating gate and the semiconductor substrate within the instant inventive flash memory structure.

Figure 2:
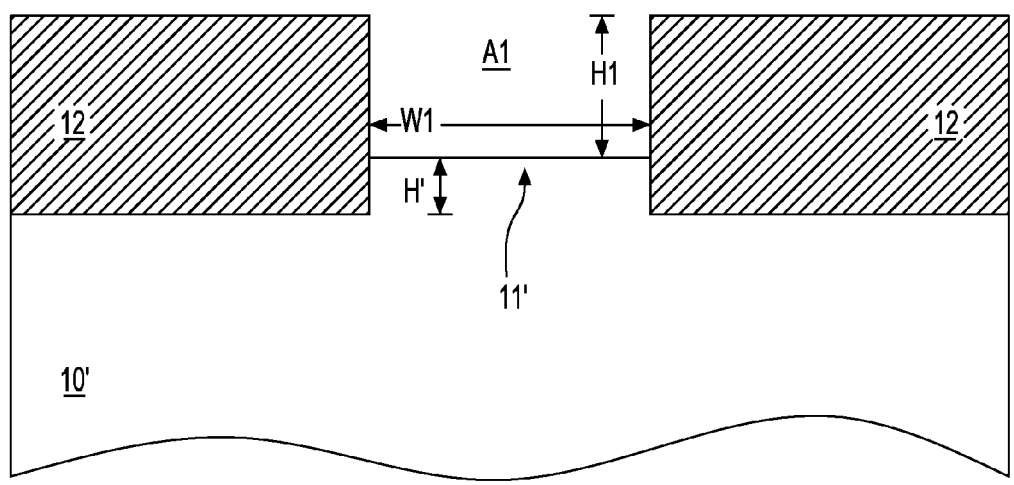

FIG. 2 shows the results of etching the active region 11 mesa of height H within the semiconductor substrate 10 that is illustrated within the schematic cross-sectional diagram of FIG. 1 to provide an active region 11' mesa of height H' within a semiconductor substrate 10'. The active region 11' is recessed within an aperture A1 (i.e., a first aperture) surrounded and bounded by the isolation region 12. Typically, the height H' is in a range from about 300 to about 1000 nanometers. This aperture A1 has a linewidth W1 from about 100 to about 5000 nanometers and a height (or depth) H1 from about 200 nanometers to about 1000 nanometers.

The foregoing etching of the active region 11 to provide the active region 11' may be effected using methods and materials that are otherwise generally conventional in the semiconductor fabrication art. Most generally included are wet chemical etch methods which are generally isotropic etch methods, as well as dry plasma etch methods that may be anisotropic etch methods as well as isotropic etch methods. While by no means limiting the embodiment or the invention, a chemical modification of an upper portion of the active region 11 (i.e., such as by ion implantation) may be used to provide for a facilitated etching of the active region 11 when forming the active region 11'. Alternatively, electrochemical methods for etching that are predicated upon differing electrochemical properties between complementary doped semiconductor material regions within the active region 11 mesa that is illustrated in FIG. 1 may also be used. Such electrochemical methods are taught within Wang et al., in U.S. Pat. No. 5,129,981 and U.S. Pat. No. 5,129,982, the teachings of which are incorporated herein fully by reference.

Figure 3:
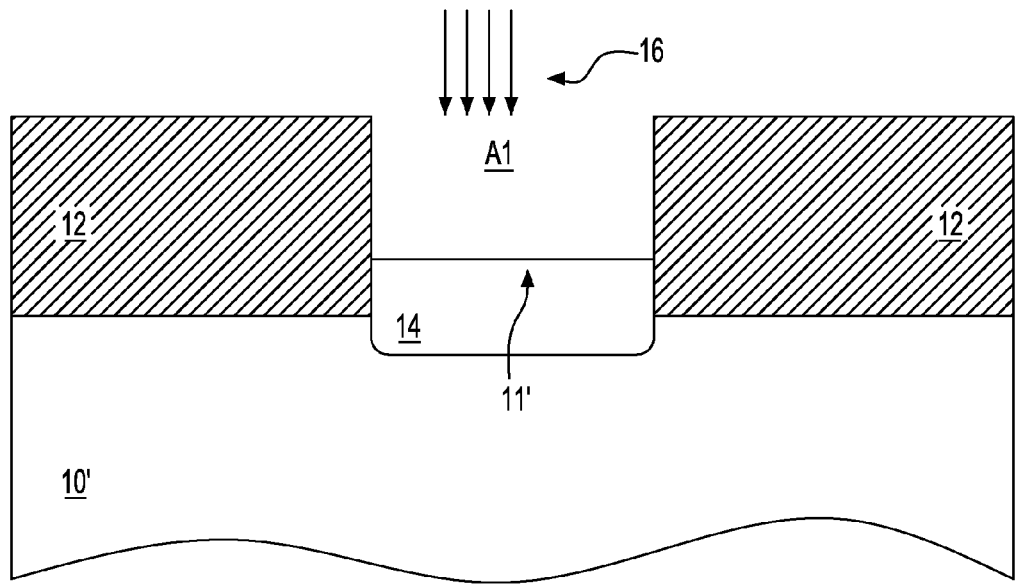

FIG. 3 shows the results of forming a doped well 14 within the active region 11' within the semiconductor substrate 10' that is illustrated in FIG. 2, while using the isolation region 12 as an ion implantation mask, in conjunction with a dose of dopant implanting ions 16. The dose of dopant implanting ions 16 may be of either dopant polarity as is appropriate to a polarity (i.e., a conductivity type) of a flash memory structure desired to be fabricated. Conventional dopant ions, such as but not limited to arsenic, antimony, boron and phosphorus dopant ions, may be used. Typically the dose of dopant implanting ions 16 is provided at ion implantation energy from about 10 to about 200 keV. The foregoing dopant implanting conditions for providing the dopant implanting ions 16 will typically provide a depth of the doped well 14 from about 10 to about 100 nanometers into the active region 11', with a concentration from about $10^{15}$ to about $10^{18}$ dopant ions per cubic centimeter within the doped well.

Figure 4:
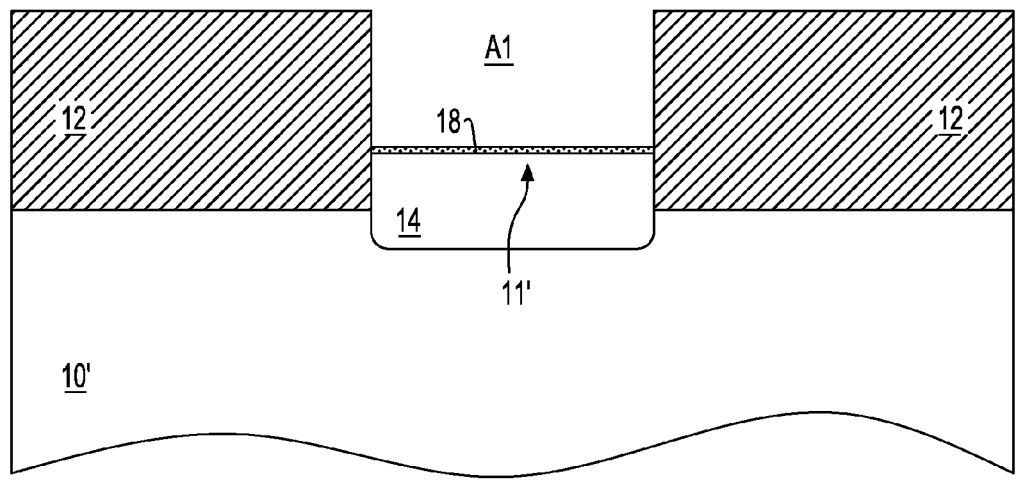

FIG. 4 shows a tunneling dielectric 18 located and formed upon the active region 11' (i.e., including the doped well 14) within the semiconductor substrate 10' exposed within the aperture A1 surrounded by the isolation region 12 that is illustrated in FIG. 3. The tunneling dielectric 18 may comprise any of several dielectric materials from which tunneling dielectrics are conventionally formed. As discussed above, the tunneling dielectric 18 may comprise an oxide dielectric material, although the tunneling dielectric 18 is not necessarily so limited to only an oxide dielectric material. Typically, the tunneling dielectric 18 is formed to, and has, a thickness from about 5 to about 50 nanometers. The tunneling dielectric 18 may be formed using any of several methods that are otherwise generally conventional in the semiconductor fabrication art. Included in particular are thermal or plasma treatment methods, chemical vapor deposition methods (including atomic layer deposition methods) and physical vapor deposition methods (including sputtering methods).

Typically, the tunneling dielectric 18 comprises a thermal silicon oxide dielectric material formed incident to thermal oxidation of a silicon semiconductor substrate 10'. Under such circumstances, the tunneling dielectric 18 is formed self-aligned to the active region 11', as is illustrated in FIG. 4. Alternatively, if the tunneling dielectric 18 is formed using a deposition method, the tunneling dielectric 18 would additionally bridge to the sidewall and top surfaces of the isolation region 12.

Figure 5:
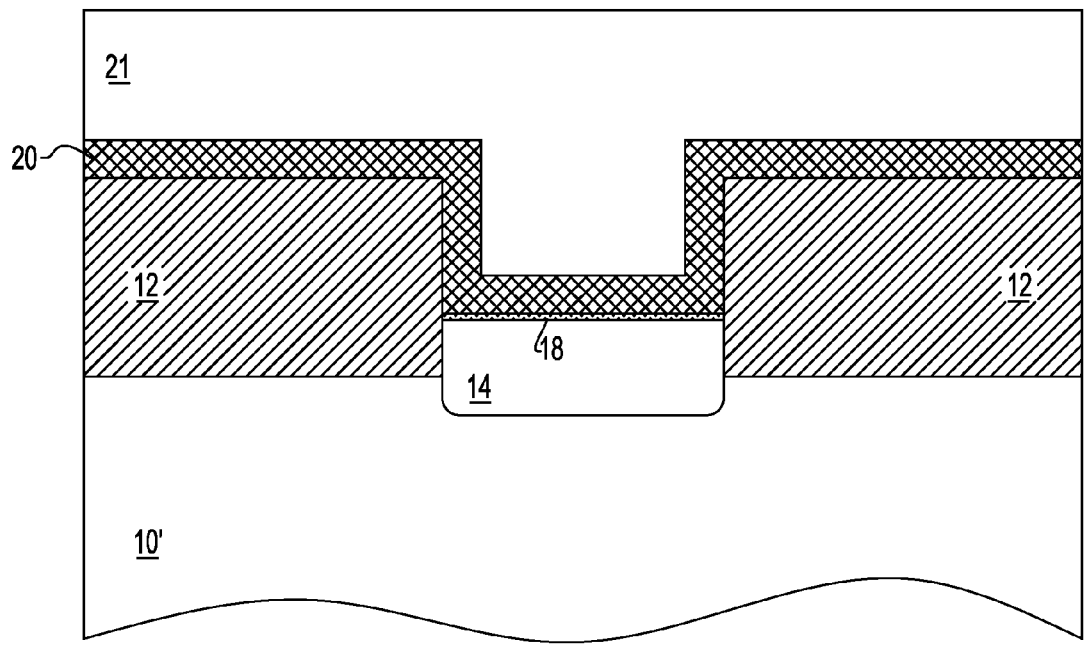

FIG. 5 shows a floating gate material layer 20 located and formed upon the flash memory structure of FIG. 4, and in particular located and formed upon the isolation region 12, as well as the tunneling dielectric 18 that is exposed within the aperture A1. The floating gate material layer 20 may comprise any of several conductor materials from which may generally be comprised gate conductors within semiconductor structures such as flash memory structures. Such conductor materials may include, but are not necessarily limited to certain metal, metal alloy, metal silicide, metal nitride, doped polysilicon (i.e., having a dopant concentration from about 1e18 to about 1e22 dopant atoms per cubic centimeter) and polycide (i.e., doped polysilicon/metal silicide stack) conductor materials. Preferably, the floating gate material layer 20 comprises a doped polysilicon conductor material that has a thickness that is generally less than one-quarter the linewidth W of the aperture A1 that is illustrated in FIG. 2. Typically, such a thickness will be from about 25 to about 250 nanometers. As is illustrated within the schematic cross-sectional diagram of FIG. 5, the floating gate material layer 20 is formed conformally upon the semiconductor structure of FIG. 4 (i.e., having a generally uniform single thickness, within the context of manufacturing variability that is often less than about 5 percent).

FIG. 5 also shows a planarizing layer 21 located and formed upon floating gate material layer 20. The planarizing layer 21 comprises a planarizing material that is desirable to facilitate further processing of the flash memory structure whose schematic cross-sectional diagram is illustrated in FIG. 5.

The planarizing layer 21 may comprise any of several planarizing materials. Such planarizing materials may include, but are not necessarily limited to, spin-on-polymer materials such as but not limited to organic polymer materials and photoresist materials, as well as spin-on-glass materials. The planarizing layer 21 may be formed using methods that are generally conventional in the semiconductor fabrication art, and that are also appropriate to the planarizing material from which is comprised the planarizing layer 21. Such methods may include, but are not necessarily limited to, spin-on methods, chemical vapor deposition methods and physical vapor deposition methods.

Figure 6:
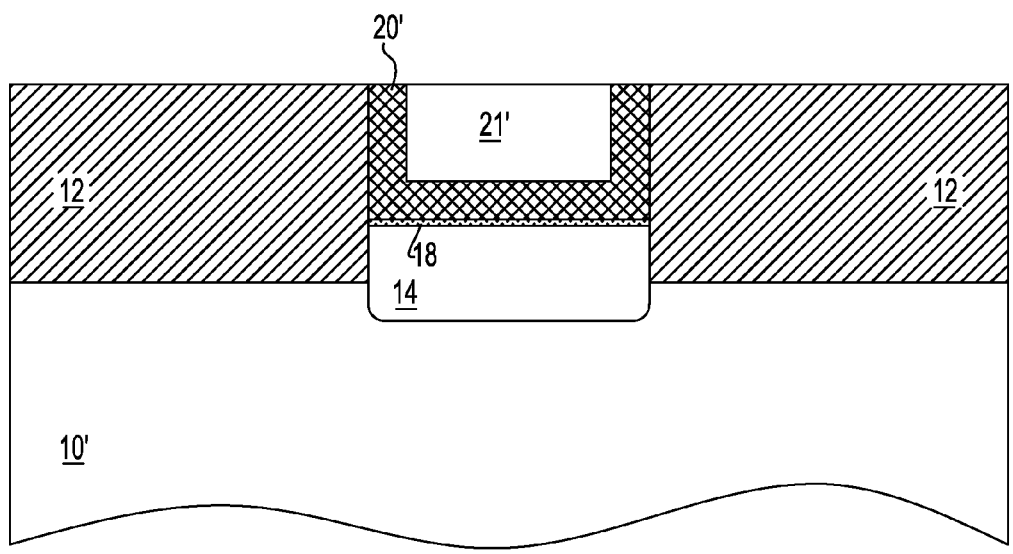

FIG. 6 shows a planarizing layer 21' and a floating gate 20' that result from planarizing the planarizing layer 21 and the floating gate material layer 20 that are illustrated in FIG. 5. Thus, a top surface of the planarizing layer 21' and a top surface of the floating gate 20' are coplanar with, and do not rise above, a top surface of the isolation region 12. Such a particular planarizing may use the isolation region 12 as a planarizing stop layer or a planarizing indicator layer. The planarizing of the planarizing layer 21 and the floating gate material layer 20 to form the planarizing layer 21' and the floating gate 20' may be effected using planarizing methods that are otherwise generally conventional in the semiconductor fabrication art. Such planarizing methods may include, but are not necessarily limited to, reactive ion etch (RIE) etchback planarizing methods, mechanical planarizing methods and chemical mechanical polish (CMP) planarizing methods. Due to superior manufacturing performance and resulting improved planarity, chemical mechanical polish planarizing methods are often preferred.

Figure 7:
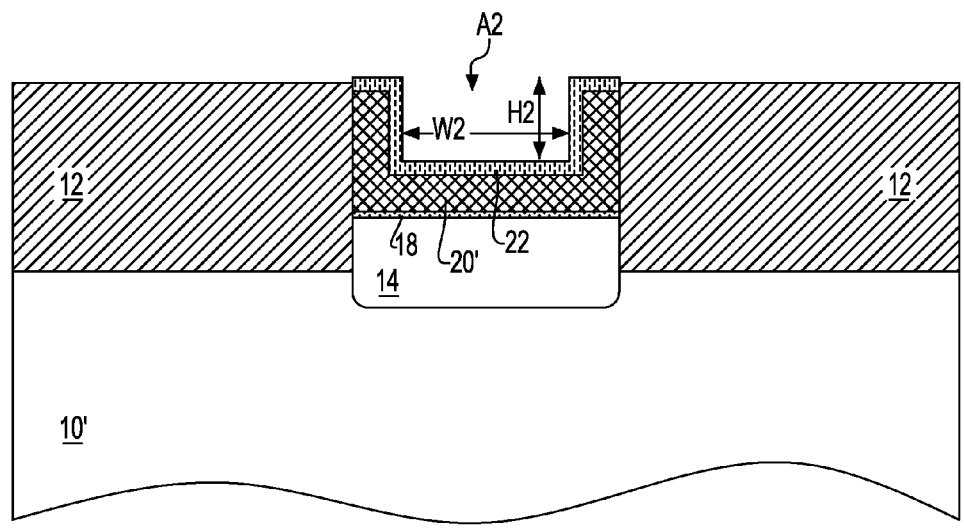

FIG. 7 first shows the results of stripping the planarizing layer 21' from the semiconductor structure of FIG. 6 to form an aperture A2 (i.e., a second aperture) within the floating gate 20' which has a "U" shape. The planarizing layer 21' may be stripped from the floating gate 20' within the flash memory structure that is illustrated in FIG. 6 to provide in part the flash memory structure of FIG. 7 while using stripping methods that are otherwise generally conventional in the semiconductor fabrication art. Included in particular, but by no means limiting the instant embodiment or the invention, are wet chemical stripping methods and dry plasma stripping methods, as well as combinations of wet chemical stripping methods and dry plasma stripping methods. As is illustrated within the schematic cross-sectional diagram of FIG. 7, the aperture A2 has a linewidth W2 typically from about 50 to about 4000 nanometers and a height (i.e., depth) H2 from about 100 to about 800 nanometers.

FIG. 7 also shows an intergate dielectric 22 located and formed upon the floating gate 20'. The intergate dielectric 22 may comprise any of several dielectric materials from which may generally be comprised gate dielectrics within semiconductor structures. Such dielectric materials may include, but are not necessarily limited to, generally low dielectric constant dielectric materials having a dielectric constant less than about 20. Such low dielectric constant dielectric materials encompass the silicon oxide, silicon nitride and silicon oxynitride dielectric materials from which may be comprised the tunneling dielectric 18. Such dielectric materials may also include, but are also not necessarily limited to, generally higher dielectric constant dielectric materials having a dielectric constant greater than about 50, and preferably at least about 100. Such generally higher dielectric constant dielectric materials may include, but are not limited to hafnium oxide dielectric materials, hafnium silicate dielectric materials, titanium oxide dielectric materials, aluminum oxide dielectric materials, lead-zirconate-titanate (PZT) dielectric materials and barium-strontium-titanate (BST) dielectric materials. Typically, the intergate dielectric 22 comprises a laminate of silicon oxide and silicon nitride dielectric materials that has a thickness from about 5 to about 50 nanometers.

A particular, but by no means limiting, example of methods that may be used to form such a silicon oxide and silicon nitride laminated intergate dielectric 22 is also taught within Chung et al., in U.S. Pat. No. 6,914,013, as cited within the Description of the Related art, the teachings of which are incorporated herein fully by reference.

Although FIG. 7 illustrates the intergate dielectric 22 as formed nominally conformally aligned to the floating gate 20', such a nominal conformal alignment results generally only incident to a thermal or plasma processing of the floating gate 20' when the floating gate 20' comprises a material that is thermal or plasma processable to form an aligned intergate dielectric 22. Since many of the generally higher dielectric constant gate dielectric materials (i.e., including those that are listed above) are deposited dielectric materials, they are not generally formed aligned to the floating gate 20' that is illustrated in FIG. 7, but rather as a blanket conformal intergate dielectric upon the semiconductor structure of FIG. 7 including the isolation region 12 as well as the floating gate 20'.

The use of a generally higher dielectric constant material for the intergate dielectric 22 (i.e., in comparison with the tunneling dielectric 18) may also be valuable in providing an enhanced capacitive coupling coefficient ratio within a flash memory structure in accordance with the instant embodiment and the invention.

Figure 8A:
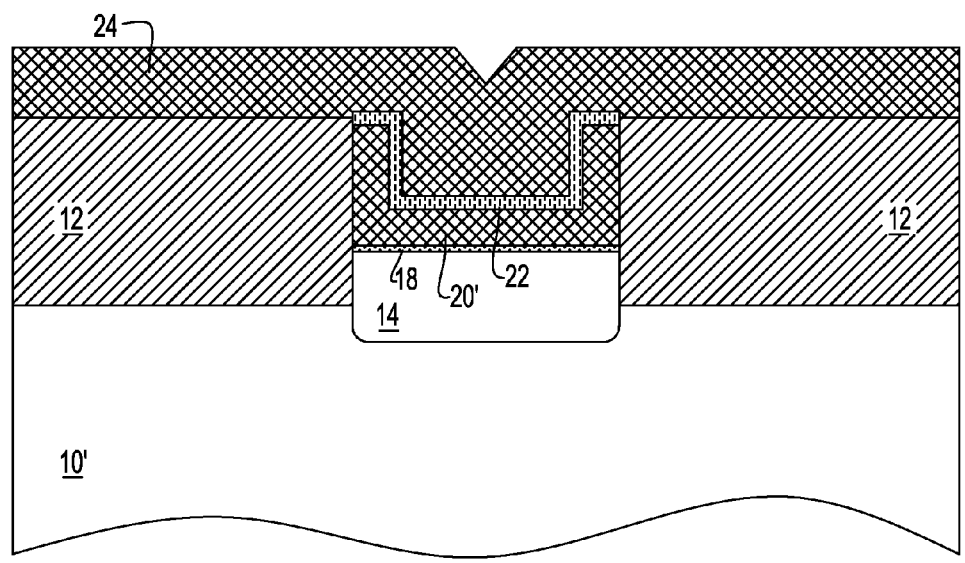

FIG. 8A shows a control gate 24 located and formed upon the flash memory structure whose schematic cross-sectional diagram is illustrated in FIG. 7, after having formed the intergate dielectric 22 aligned upon the floating gate 20' within the flash memory structure whose schematic cross-sectional diagram is illustrated in FIG. 7. In particular, the control gate 24 (which completely fills the aperture A2, but need not necessarily completely fill the aperture A2) is located and formed upon the intergate dielectric 22 (which does not completely fill the aperture A2) and spanning to the isolation region 12.

The control gate 24 may comprise materials and be formed using methods that are analogous, equivalent or identical to the materials and methods that are used for forming the floating gate 20' that is illustrated in FIG. 6, or more particularly the floating gate material layer 20 that is illustrated in FIG. 5. Preferably, the control gate 24 comprises a polysilicon material that has a thickness from about 200 to about 1000 nanometers, although neither the embodiment nor the invention is so limited.

Figure 8B:
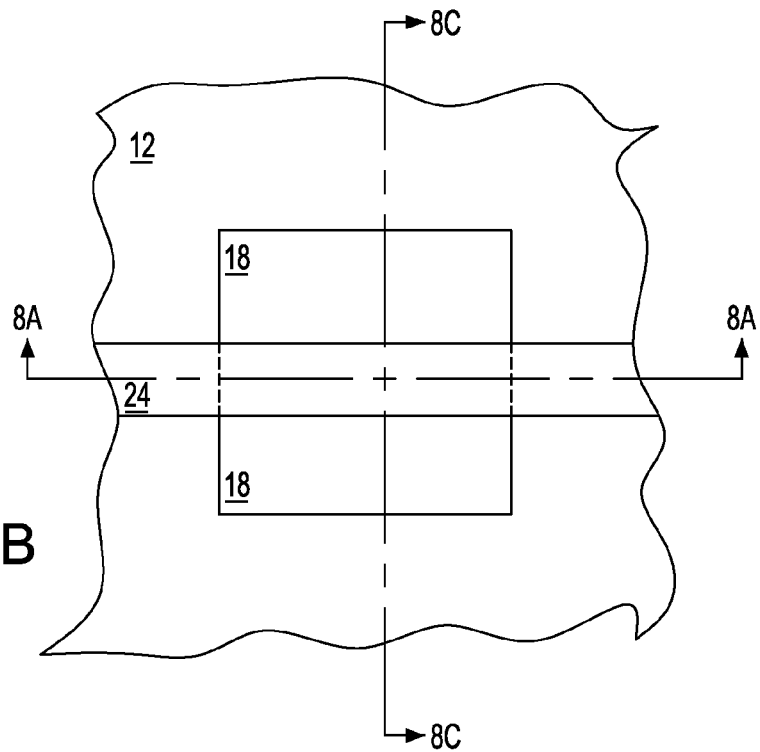

FIG. 8B shows a schematic plan-view diagram that illustrates an interrelationship between schematic cross-sectional diagrams that include the schematic cross-sectional diagram of FIG. 8A. FIG. 8B shows the isolation region 12 that surrounds the tunneling dielectric 18 that is located and formed aligned upon the active region 11' that is not specifically illustrated in FIG. 8B. In addition, FIG. 8B shows the control gate 24 that spans over the tunneling dielectric 18 and the isolation region 12.

Figure 8C:
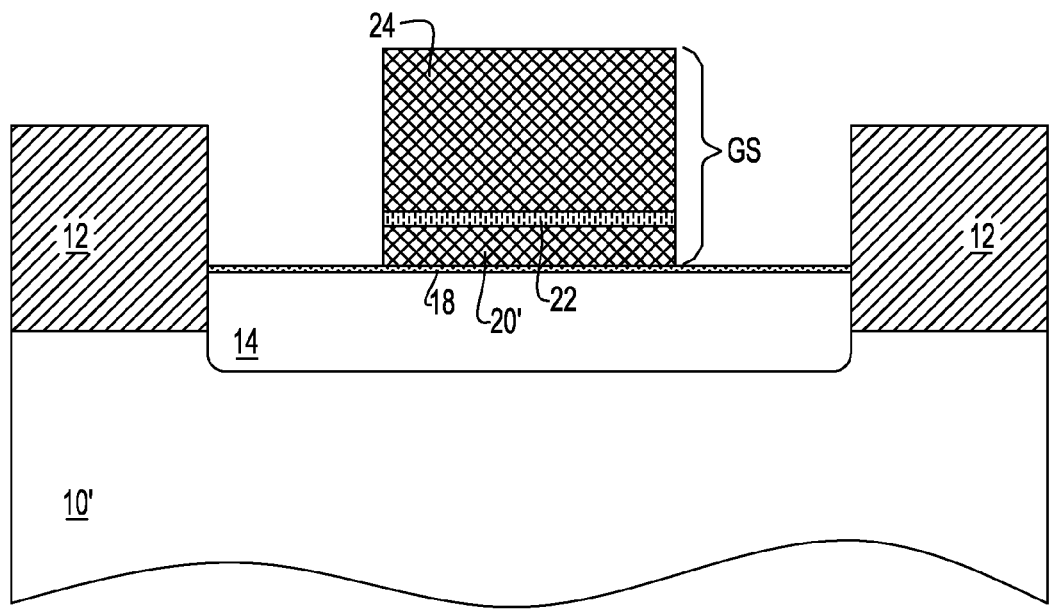

FIG. 8C shows an additional schematic cross-sectional diagram that corresponds with the schematic plan-view diagram of FIG. 8B and is specifically illustrated within the schematic plan-view diagram of FIG. 8B as perpendicular to the schematic cross-sectional diagram of FIG. 8A. Like structures and like layers are designated with identical reference numerals within FIG. 8A, FIG. 8B and FIG. 8C. Within FIG. 8C, a gate stack GS includes the floating gate 20', the intergate dielectric 22 and the control gate 24.

Figure 9:
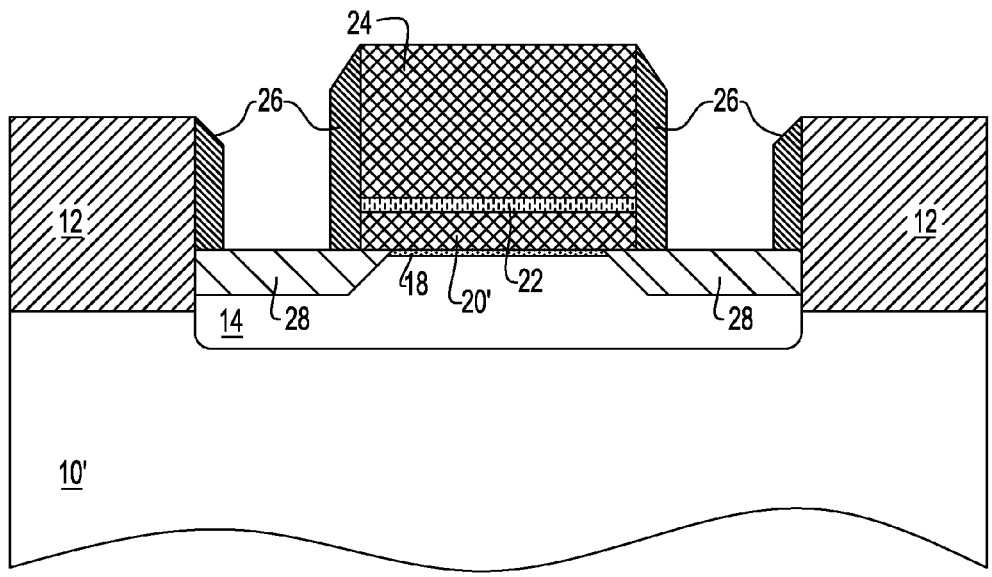

FIG. 9 first shows a plurality of spacers 26 located adjacent and adjoining: (1) the gate stack GS that includes the floating gate 20', the intergate dielectric 22 and the control gate 24; and (2) exposed sidewalls of the isolation region 12.

The spacers 26 may comprise materials, have dimensions and be formed using methods that are otherwise generally conventional in the semiconductor fabrication art. Typically, the spacers 26 comprise a dielectric material or a laminate of dielectric materials, although neither the embodiment nor the invention is necessarily so limited, since while less common, conductor spacers are also known. Typically the spacers 26 are formed with the characteristic pointed shape while using an anisotropic etching of a blanket layer of spacer material.

Also illustrated within the schematic cross-sectional diagram of FIG. 9 is a plurality of source and drain regions 28 located and formed into the active region 11' of the semiconductor substrate 10' at locations other than those covered by gate stack GS that comprises the floating gate 20', the intergate dielectric 22 and the control gate 24. The plurality of source and drain regions 28 is formed into the semiconductor substrate 10' at locations other than those covered by the gate stack GS while using a dopant of appropriate polarity for a flash memory structure that is desired to be fabricated, and also while using a two-step ion implantation method. A first step within the two-step ion implantation method uses the gate stack GS, absent the spacers 26, as a mask to form extension regions within the active region 11' that are located beneath the spacers 26. A second step within the two-step ion implantation method uses the gate stack GS with the spacers 26 as a mask, to form contact region portions of the source and drain regions 28 into the active region 11' of the semiconductor substrate 10'.

Figure 10:
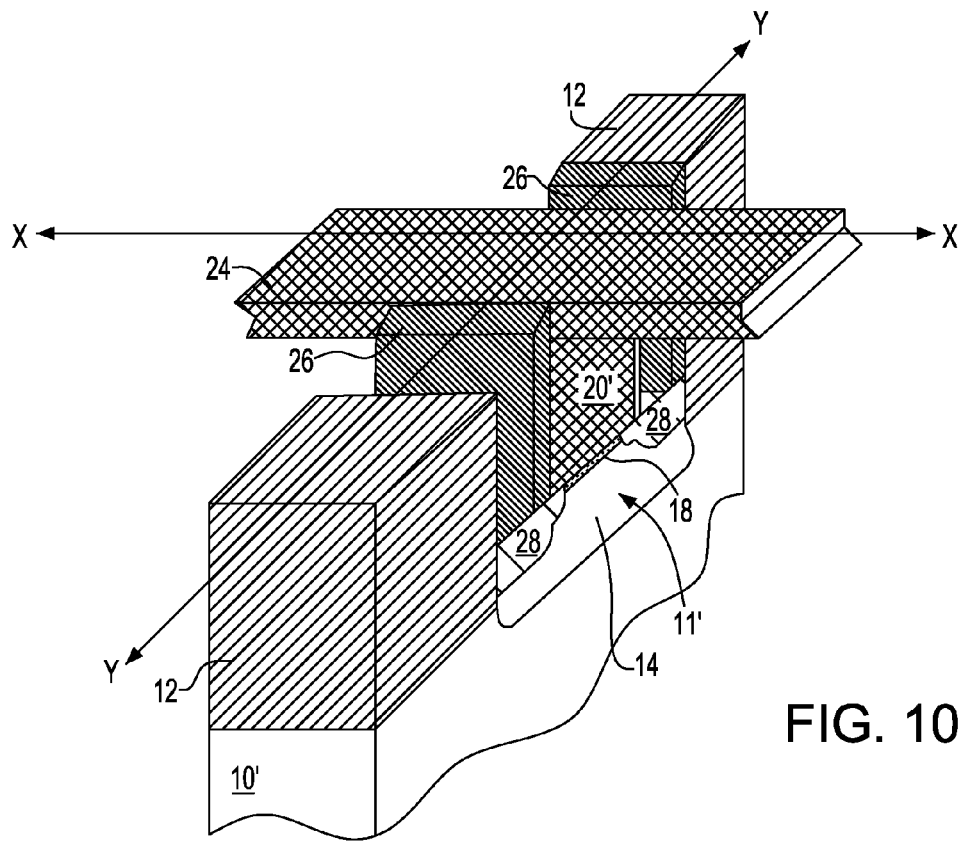

FIG. 10 shows a schematic perspective-view diagram of the flash memory structure whose schematic cross-sectional view diagram is illustrated in FIG. 9. FIG. 10 shows the semiconductor substrate 10', which includes the active region 11' that is bounded by the isolation region 12 and recessed with respect to the isolation region 12. A flash memory structure is located within the active region 11' that is bounded by the isolation region 12 and recessed with respect to the isolation region 12. The flash memory structure includes a tunneling dielectric 18 located upon the active region 11' of the semiconductor substrate 10'. A floating gate 20' is located upon the tunneling dielectric 18. An intergate dielectric is, while not visible, located upon the floating gate 20'. Finally, a control gate 24 is located upon the intergate dielectric 22 that is not visible. FIG. 10 also shows an X-X axis that corresponds to the cross-sectional plane of FIG. 1 to FIG. 8A and a Y-Y axis that corresponds with the cross-sectional plane of FIG. 8C and FIG. 9.

As is illustrated more particularly in FIG. 8A, the floating gate 20' within the flash memory structure of the instant embodiment does not rise above the isolation region 12 that surrounds an active region 11' within and upon which is fabricated the flash memory structure. The floating gate 20' also has a "U" shape that defines an aperture A2 into which is located and formed the intergate dielectric 22 that does not completely fill the aperture A2 and a control gate 24 that at least more completely fills the aperture A2. Due to such a "U" shape, a flash memory structure in accordance with the embodiment and the invention is able to realize a higher capacitive coupling coefficient ratio (CCCR) since an intergate capacitive coupling area is greater than a tunneling capacitive coupling area. As is further understood within the context of FIG. 1 to FIG. 10, a flash memory structure in accordance with the embodiment and invention is fabricated in a self-aligned fashion with the floating gate 20' that consists of a single U shaped layer planarized to and not rising above the isolation region 12, and thus the flash memory structure of the instant embodiment is fabricated with a limited topography that provides for enhanced manufacturability.

Although the sole preferred illustrative embodiment of the present invention has been described herein with reference to the accompanying drawings, it is to be understood that the invention is not limited to this particular sole preferred embodiment, and that various other changes and modifications may be made by one skilled in the art without departing from the scope or spirit of the invention.

What is claimed is:

1. A method for fabricating a flash memory structure comprising:
   providing a semiconductor substrate that includes an isolation region that surrounds an active region of the semiconductor substrate;
   recessing the active region with respect to the isolation region to provide a recessed active region within a first aperture within the isolation region;
   forming upon the recessed active region a tunneling dielectric;
   forming upon the tunneling dielectric a floating gate that does not rise above the isolation region;
   forming upon the floating gate an intergate dielectric;
   forming upon the intergate dielectric a control gate; and
   forming within the active region at locations not covered by the floating gate a plurality of source and drain regions.

2. The method of claim 1, wherein the first aperture has:
   a linewidth from about 100 to about 5000 nanometers; and
   a depth from about 200 to about 1000 nanometers.

3. The method of claim 2, wherein the floating gate comprises a U shaped floating gate that includes a second aperture.

4. The method of claim 3, wherein the second aperture has:
   a linewidth from about 50 to about 4000 nanometers; and
   a depth from about 100 to about 800 nanometers.

5. The method of claim 1, wherein the forming the floating gate uses a blanket layer deposition and planarizing process.

6. The method of claim 1, wherein the forming the floating gate self-aligns the floating gate to the first aperture.

7. The method of claim 1, wherein the forming the intergate dielectric uses a thermal oxidation process with respect to the floating gate.

8. The method of claim 1, wherein the forming the control gate self aligns the control gate with respect to the second aperture.

9. The method of claim 1, wherein the intergate dielectric has a higher dielectric constant than the tunneling dielectric.

10. The method of claim 1, wherein the semiconductor substrate comprises a semiconductor materials selected from the group consisting of silicon, germanium, silicon-germanium alloy, silicon-carbon alloy, silicon-germanium-carbon alloy, compound semiconductor materials and a combination thereof.

11. The method of claim 1, wherein the tunneling dielectric has a thickness from 5 nm to 50 nm.

12. The method of claim 1, wherein the tunneling dielectric is formed using at least one of thermal or plasma treatment methods, chemical vapor deposition methods and physical vapor deposition methods.

13. The method of claim 1, wherein the tunneling dielectric comprises a thermal silicon oxide dielectric material formed by thermal oxidation of the semiconductor substrate.

14. The method of claim 1, wherein the floating gate comprises a conductor selected from the group consisting of metal, metal alloy, metal silicide, metal nitride, doped polysilicon, polycide and combinations thereof.

15. The method of claim 14, wherein the conductor comprises a thickness ranging from 25 nm to 250 nm.

16. The method of claim 1, wherein the integate dielectric comprises silicon oxide, silicon nitride, silicon oxynitride, hafnium oxide dielectric materials, hafnium silicate dielectric materials, titanium oxide dielectric materials, aluminum oxide dielectric materials, lead-zirconate-titanate (PZT) dielectric materials, barium-strontium-titanate (BST) dielectric materials or a combination thereof.

17. The method of claim 1, wherein the integate dielectric has a thickness ranging from 5 nm to 50 nm.

18. The method of claim 1, wherein the integrate dielectric is a conformally deposited layer.

19. The method of claim 1, wherein the control gate comprises a conductor selected from the group consisting of metal, metal alloy, metal silicide, metal nitride, doped polysilicon, polycide and combinations thereof.

20. The method of claim 1, wherein the control gate has a thickness ranging from 200 nm to 1000 nm.

* * * * *